(12) United States Patent
Zan et al.

(10) Patent No.: US 9,917,268 B1
(45) Date of Patent: Mar. 13, 2018

(54) TRANSISTOR AND METHOD OF MANUFACTURING THE SAME

(71) Applicant: E Ink Holdings Inc., Hsinchu (TW)

(72) Inventors: Hsiao-Wen Zan, Hsinchu (TW);
Shao-Fu Peng, Hsinchu (TW);
Cheng-Hang Hsu, Hsinchu (TW)

(73) Assignee: E Ink Holdings Inc., Hsinchu (TW)

( * ) Notice: Subject to any disclaimer, the term of this patent is extended or adjusted under 35 U.S.C. 154(b) by 0 days.

(21) Appl. No.: 15/480,355

(22) Filed: Apr. 5, 2017

(30) Foreign Application Priority Data

Sep. 13, 2016 (CN) .......................... 2016 1 0817754

(51) Int. Cl.
| | |
|---|---|
| *H01L 27/148* | (2006.01) |
| *H01L 29/80* | (2006.01) |
| *H01L 21/8234* | (2006.01) |
| *H01L 21/8238* | (2006.01) |
| *H01L 21/336* | (2006.01) |
| *H01L 51/05* | (2006.01) |
| *H01L 51/10* | (2006.01) |
| *H01L 51/00* | (2006.01) |

(52) U.S. Cl.
CPC ...... *H01L 51/0508* (2013.01); *H01L 51/0012* (2013.01); *H01L 51/0023* (2013.01); *H01L 51/107* (2013.01); *H01L 51/004* (2013.01); *H01L 51/0036* (2013.01)

(58) Field of Classification Search
CPC ............. H01L 51/0012; H01L 51/0023; H01L 51/0508; H01L 27/10841; H01L 27/0664; H01L 27/10864; H01L 27/2454; H01L 29/41708; H01L 29/1095; H01L 29/7395; H01L 29/7802; H01L 29/732; H01L 29/7371; H01L 29/1305
See application file for complete search history.

(56) References Cited

U.S. PATENT DOCUMENTS

| | | |
|---|---|---|
| 2006/0043363 A1 | 3/2006 | Miyamoto |
| 2007/0158736 A1 | 7/2007 | Arai et al. |
| 2011/0284949 A1 | 11/2011 | Meng et al. |
| 2014/0209883 A1 | 7/2014 | Zan et al. |

OTHER PUBLICATIONS

Hsiao-Wen Zan et al., "High output current in vertical polymer space-charge-limited transistor induced by self-assembled monolayer," Applied Physics Letters 101, 093307, 2012.
orresponding Taiwanese office action issued on ecember 20, 2017.

*Primary Examiner* — Hsien Ming Lee
(74) *Attorney, Agent, or Firm* — CKC & Partners Co., Ltd.

(57) ABSTRACT

A method of forming a transistor includes: forming a stack structure including a first conductive layer, a first insulating layer, a second conductive layer, and a second insulating layer on a substrate; patterning the first insulating layer, the second conductive layer, and the second insulating layer to form at least one opening passing through the first insulating layer, the second conductive layer, and the second insulating layer; forming a semiconductor layer over the second insulating layer and filling the opening; removing the portion of the semiconductor layer over the second insulating layer, in which the portion of the semiconductor layer filled in the opening constitutes at least one semiconductor channel; and forming a third conductive layer over the semiconductor channel.

8 Claims, 8 Drawing Sheets

TRANSISTOR AND METHOD OF MANUFACTURING THE SAME

RELATED APPLICATIONS

This application claims priority to China Application Serial Number 201610817754.5, filed Sep. 13, 2016, the entity of which is incorporated herein by reference.

BACKGROUND

Technical Field

The present disclosure relates to a transistor and a method of manufacturing the transistor.

Description of Related Art

Transistor is a kind of solid semiconductor devices which can be used to amplify, switch, regulate, and/or modulate signals and with other functions. The carrier mobility of the semiconductor in the transistor is an important factor which affects the performance of the transistor. Hence, contemporary researchers in studying semiconductor are dedicated to achieving higher carrier mobility.

SUMMARY

One aspect of the present disclosure is to provide a transistor having a high carrier mobility. The transistor includes a first electrode, a first insulating layer, a second electrode, a second insulating layer, a semiconductor channel layer and a third electrode. The first insulating layer is positioned over the first electrode. The second electrode is positioned over the first insulating layer. The second insulating layer is positioned over the second electrode. The semiconductor channel layer is extended upwards from the first electrode and passes through the first insulating layer, the second electrode, and the second insulating layer. The third electrode is positioned over the second insulating layer and in contact with a top surface of the semiconductor channel layer.

According to some embodiments of the present disclosure, the semiconductor channel layer has a sidewall in contact with the first insulating layer, the second electrode, and the second insulating layer, in which the semiconductor channel layer has a crystal plane with Miller Index (010).

According to some embodiments of the present disclosure, the third electrode includes a hole injection layer and a metal layer on the hole injection layer, in which the hole injection layer is in contact with the top surface of the semiconductor channel layer.

According to some embodiments of the present disclosure, the second insulating layer includes an insulating polymer layer and a hard mask layer. The insulating polymer layer is in contact with the second electrode, and the hard mask layer is positioned on the insulating polymer layer.

According to some embodiments of the present disclosure, the semiconductor channel layer has a height substantially equal to the summed thickness of the first insulating layer, the second electrode, and the second insulating layer.

Another aspect of the present disclosure is to provide a method of manufacturing a transistor with excellent performance. The method includes the following operation: sequentially forming a first conductive layer, a first insulating layer, a second conductive layer, and a second insulating layer in stack on a substrate; patterning the first insulating layer, the second conductive layer and the second insulating layer to form at least one opening passing through the first insulating layer, the second conductive layer, and the second insulating layer; forming a semiconductor layer over the second insulating layer and filling the opening; removing a portion of the semiconductor layer positioned over the second insulating layer, in which a remained portion of the semiconductor layer in the opening form a semiconductor channel; and forming a third conductive layer over the semiconductor channel.

According to some embodiments of the present disclosure, forming the third conductive layer over the semiconductor channel includes: forming a hole injection layer on the semiconductor channel; and forming metal layer on the hole injection layer.

According to some embodiments of the present disclosure, patterning the first insulating layer, the second conductive layer, and the second insulating layer includes the following steps: disposing a plurality of particles on the second insulating layer; depositing a mask layer covering the particles and the second insulating layer; removing the particles and a portion of the mask layer positioned on the particles to form a patterned mask layer on the second insulating layer, wherein the patterned mask layer has a plurality of apertures exposing a portion of the second insulating layer; and sequentially etching the second insulating layer, the second conductive layer, and the first insulating layer through the apertures of the patterned mask layer to form the opening passing through the first insulating layer, the second conductive layer, and the second insulating layer.

According to some embodiments of the present disclosure, sequentially etching the second insulating layer, the second conductive layer, and the first insulating layer includes: applying a dry etching process to etch the second insulating layer; applying a wet etching process to etch the second conductive layer; and applying a dry etching process to etch the first insulating layer.

According to some embodiments of the present disclosure, the semiconductor layer includes a polymeric semiconductor, and a portion of the semiconductor layer filled in the opening has a crystal plane with Miller Index (010), whereas a portion of the semiconductor layer positioned over the second insulating layer has a crystal plane with Miller Index (100).

It is to be understood that both the foregoing general description and the following detailed description are by examples, and are intended to provide further explanation of the present disclosure as claimed.

BRIEF DESCRIPTION OF THE DRAWINGS

The accompanying drawings are included to provide a further understanding of the present disclosure, and are incorporated in and constitute a part of this specification. The drawings illustrate embodiments of the present disclosure and, together with the description, serve to explain the principles of the present disclosure. In the drawings.

DESCRIPTION OF THE EMBODIMENTS

Figure 1:
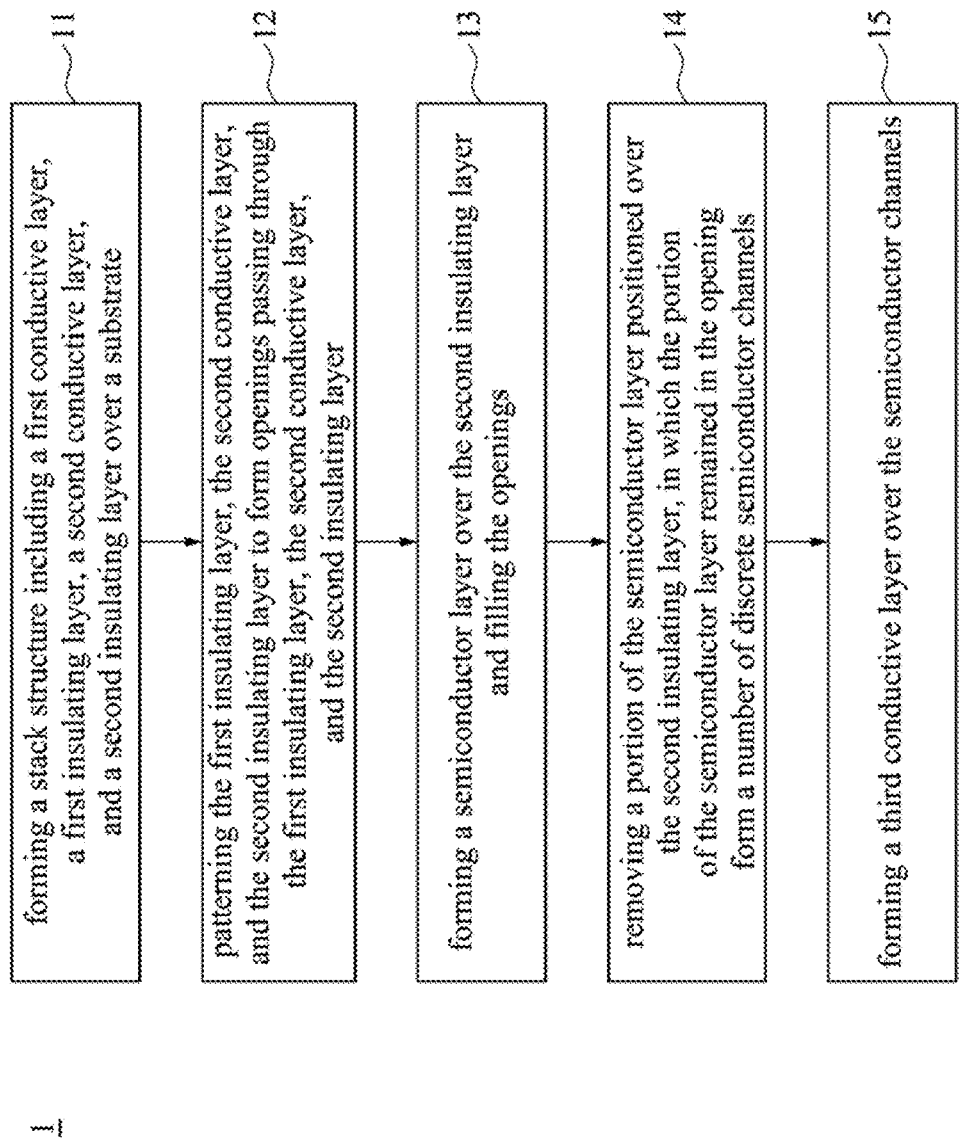
FIG. 1 is a flow chart illustrating Method 1 in all kinds of embodiments of the present disclosure to manufacture a transistor.

Reference will now be made in detail to the present embodiments of the present disclosure, examples of which are illustrated in the accompanying drawings. The example is not the only way to implement or utilize the present disclosure. The embodiments disclosed below may be combined or replaced each other in some better way. These combinations may not be described or explained further. Wherever possible, the same reference numbers are used in the drawings and the description to refer to the same or like parts.

Specific examples of components and arrangements are described below to simplify the present disclosure. These are, of course, merely examples and are not intended to be limiting. In order to simplify the drawing, some well-known structure and device may be illustrated in the Figures schematically.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the embodiments. As used herein, the term "and/or" includes any and all combinations of one or more of the associated listed items.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 is a flow chart illustrating a method 1 of manufacturing a transistor according to various embodiments of the present disclosure. The method 1 includes operations 11, 12, 13, 14 and 15. FIGS. 2-13 are cross-sectional views schematically depicting different manufacturing stages in method 1 according to some embodiments.

Figure 3:
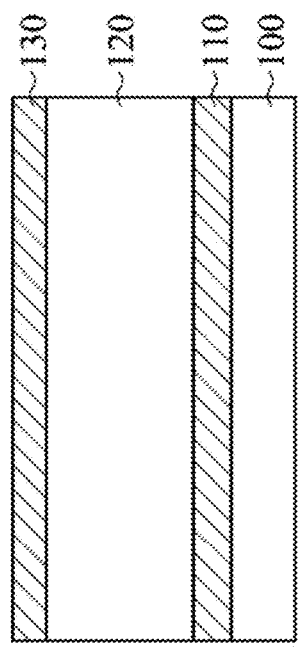
FIGS. 2-13 are cross-sectional views of Method 1 schematically depicting different manufacturing stages in some embodiments.
Figure 2:
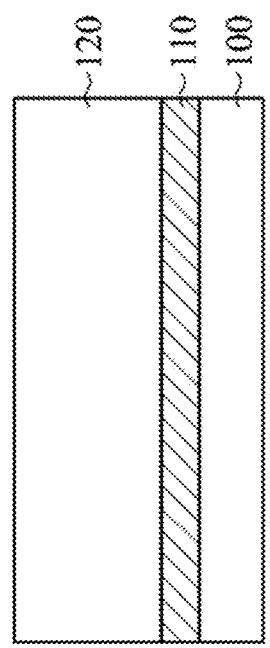
Figure 4:
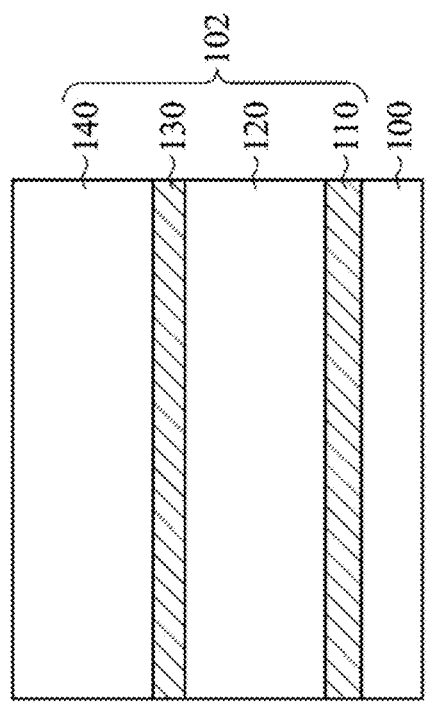

In operation 11, a stack structure which includes a first conductive layer, a first insulating layer, a second conductive layer, and a second insulating layer is formed on a substrate. FIGS. 2-4 are cross-sectional views depicting how operation 11 is performed at various stages in some embodiments of the present disclosure. Referring to FIG. 2, in some examples, a first conductive layer 110 is formed on a substrate 100. The substrate 100 may be, for example, glass substrate, silicon substrate, stainless steel substrate or the like. The first conductive layer 110 may be transparent conductive oxides containing, for example, indium tin oxide, indium zinc oxide, or other metals with appropriate conductivity, or the like. The thickness of the first conductive layer 110 may be arranged designed depending upon requirement, for example, ranging from approximately tens of nanometers to tens of micrometers. In another embodiment, a substrate (for example, glass substrate) coated with the first conductive layer (for example, indium tin oxide) is received or bought from others. Next, as depicted in FIG. 2, a first insulating layer 120 is formed on the first conductive layer 110. The first insulating layer 120 may include materials such as polyvinylpyrrolidone(PVP), polyamide, or other organic insulating materials. Alternatively, the first insulating layer 120 may include a layer of insulating oxide, such as silicon oxide, silicon nitride, and the like. The thickness of the first insulating layer 120 may be set according to requirement, for example, ranging from approximately tens of nanometers to tens of micrometers.

Referring to FIG. 3, a second conductive layer 130 is formed on the first insulating layer 120. In some embodiments, the second conductive layer 130 may include metal materials such as aluminum, neodymium, nickel, copper and/or silver, and the like. The thickness of the second conductive layer 130 may be arranged depending upon requirement, for example, ranging from approximately tens of nanometers to tens of micrometers. Afterwards, as illustrated in FIG. 4, a second insulating layer 140 is formed on the second conductive layer 130. The second insulating layer 140 may include materials such as polyvinylpyrrolidone (PVP), polyamide, or other organic insulating materials. Alternatively, the second insulating layer 140 may include a layer of insulating oxide such as silicon oxide, silicon nitride or the like. In some embodiments, the second insulating layer 140 and the first insulating layer 120 are made of the same material. For instance, the second insulating layer 140 and the first insulating layer 120 are made of polyvinylpyrrolidone (PVP). The thickness of the second insulating layer 140 may be arranged depending upon requirement, for example, ranging from approximately tens of nanometers to tens of micrometers. After the formation of the second insulating layer 140, a stack structure 102 including the first conductive layer 110, the first insulating layer 120, the second conductive layer 130, and the second insulating layer 140 is formed on the substrate 100. As depicted in FIG. 4, the first conductive layer 110, the first insulating layer 120, the second conductive layer 130, and the second insulating layer 140 are sequentially stacked on the substrate 100 from bottom to top. In some embodiments, each of the insulating layers 120, 140 has a thickness greater than the thickness of each conductive layer 110, 130.

Figure 5:
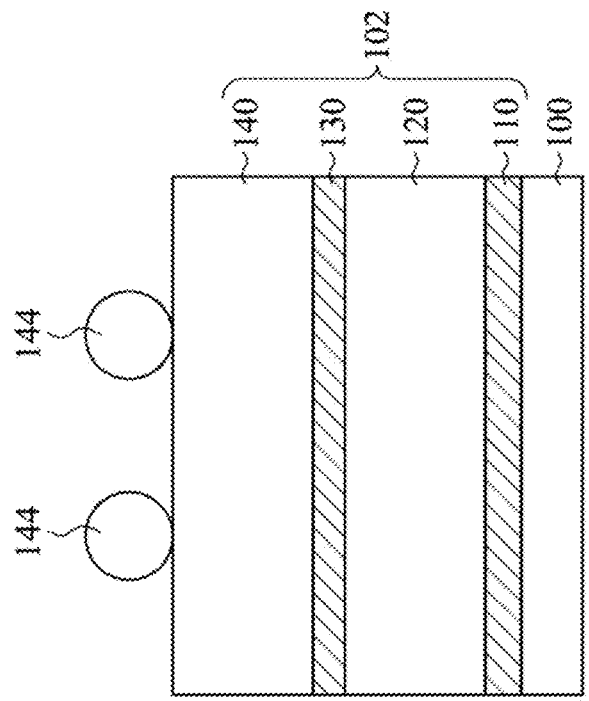
Figure 7:
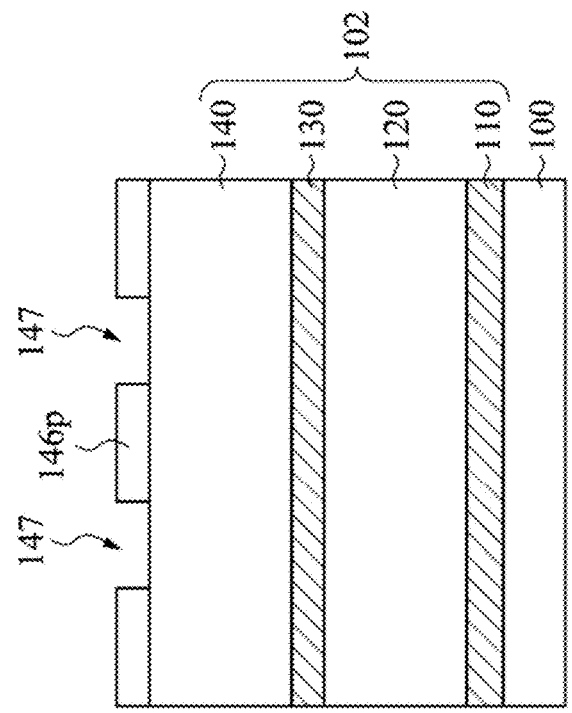
Figure 6:
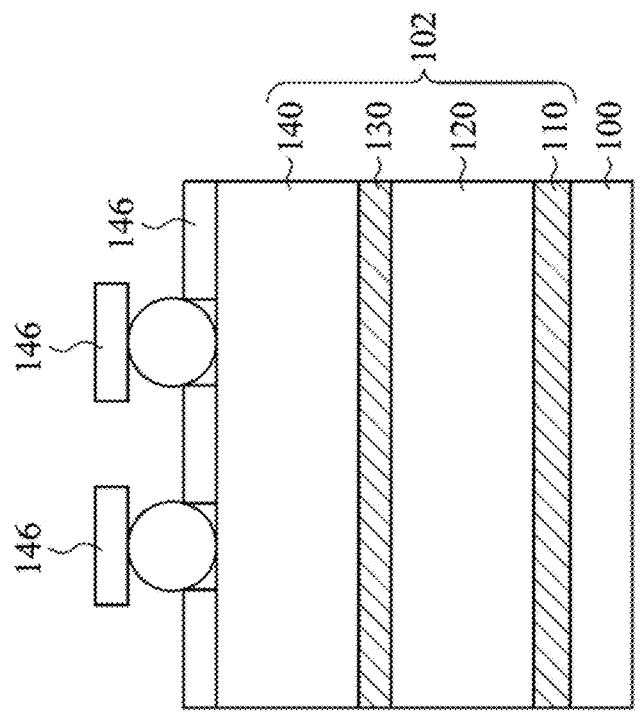
Figure 9:
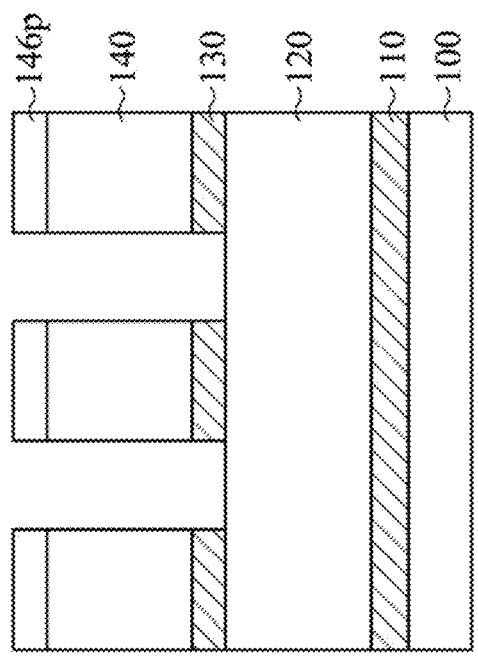
Figure 8:
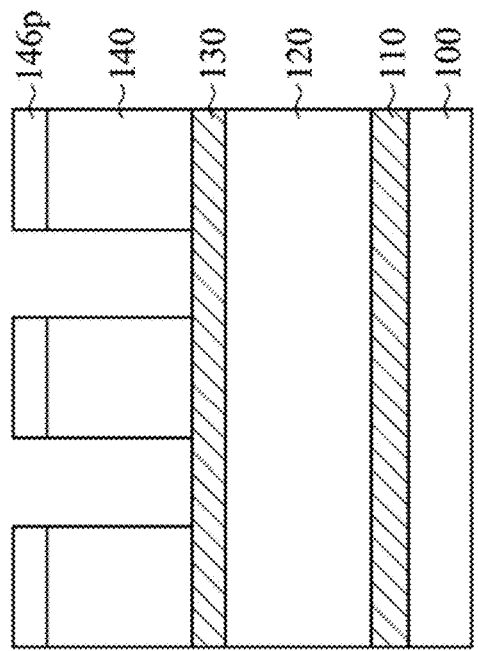
Figure 10:
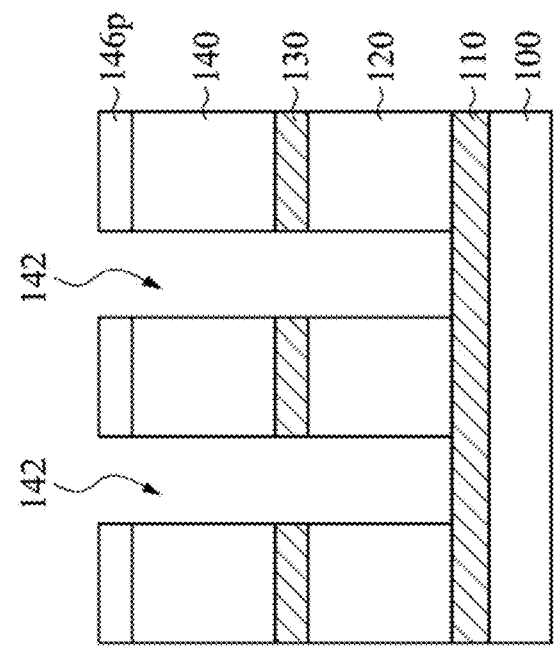

Referring to FIG. 1, in operation 12, the first insulating layer, the second conductive layer, and the second insulating layer are patterned to form a plurality of openings passing through the first insulating layer, the second conductive layer, and the second insulating layer. In FIGS. 5-10 are cross-sectional views illustrating the detail steps of operation 12 at different stages according to some embodiments of this disclosure. Referring to FIG. 5, a plurality of particles 144 are disposed on the second insulating layer 140, according to some embodiments. The particles 144, for example, may be made of polystyrene or other suitable polymeric materials. In some examples, the appearance of the particles 144 is generally spherical in shape. The diameters of the particles 144 may range from approximately tens of nanometers to tens of micrometers, for example, about 50-1000 nanometers. Next, as illustrated in FIG. 6, a mask layer 146 is deposited to cover the particles 144 and the top surface of the second insulating layer 140. Illustrative material of the mask layer 146 includes silicon oxide, silicon nitride, and the like. The thickness of the mask layer 146 is not particularly limited, for example, approximately tens of nanometers to tens of micrometers. Afterwards, as illustrated in FIG. 7, the particles 144 and the portions of the mask layer 146 formed on the particles 144 are removed so that a patterned mask layer 146*p* is formed on the second insulating layer 140. The method to remove the particles 144 has no particular restriction. In examples, an adhesive tape is used to remove the particles 144 and the portions of the mask layer 146 thereon. The patterned mask layer 146p has a plurality of apertures 147 which expose a portion of the top surface of the second insulating layer 140. The size, density and position of the apertures 147 are substantially determined by the size, density and position of the particle 144. Thereafter, as depicted in FIG. 8, the second insulating layer 140 is etched using the apertures 147 in the patterned mask layer 146p, such that the underneath second conductive layer 130 is exposed. The method to etch the second conductive layer 130 may be, for example, a dry etching technique such as a plasma etching process. Thereafter, as depicted in FIG. 9, the second conductive layer 130 is etched and the underneath first insulating layer 120 is exposed. The method to etch the second conductive layer 130 may be, for example, a wet etching process. Next, as depicted in FIG. 10, the first insulating layer 120 is etched and the underneath first conductive layer 110 is exposed. As a result, a number of openings 142 are formed passing through the first insulating layer 120, the second conductive layer 130, and the second insulating layer 140. After forming the openings 142, the patterned mask layer 146p may be kept on the second insulating layer 140 or the patterned mask layer 146p may be removed. The above embodiments depicted in FIGS. 5-10 are instances only, and other semiconductor manufacturing processes known in the art may also be applied in the embodiment of the present disclosure. Although a number of openings 142 are described in several examples or embodiments of the present disclosure, one single opening 142 is also in the scope of the embodiments of the present disclosure. For instance, a single opening 142 may be formed by photolithography-etching approaches known in the semiconductor manufacturing processes.

Figure 11:
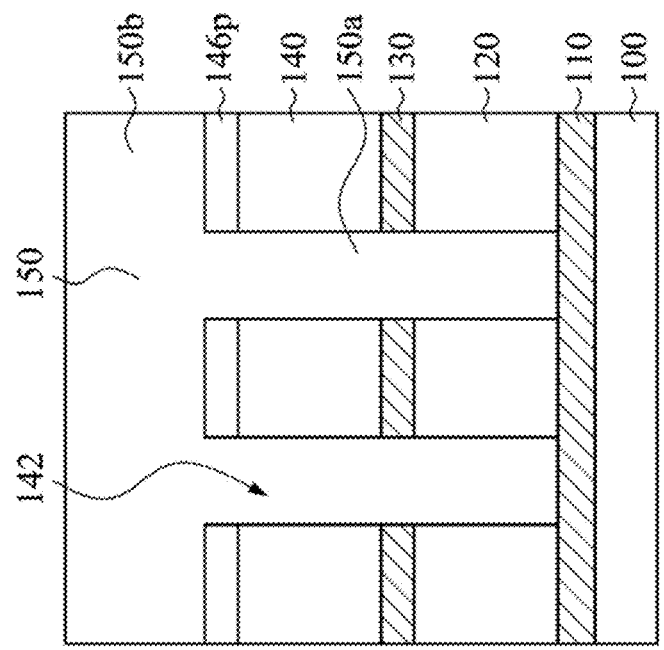

Referring to FIG. 1, in operation 13, a semiconductor layer is formed on the second insulating layer and fills the opening. With reference to FIG. 11, a semiconductor layer 150 is formed to fill in the opening 142 and cover the second insulating layer 140. In specifics, a portion 150a of the semiconductor layer 150 fills the opening 142 and another portion 150b of the semiconductor layer 150 is located on the second insulating layer 140 or on the patterned mask layer 146p. According to various embodiments of the present disclosure, the crystalline morphology of the portion 150a of the semiconductor layer 150 which fills in the hole (e.g., opening 142) is different from the crystalline morphology of the portion 150b of the semiconductor layer 150 outside the hole (e.g., opening 142). Without being bonded to any theory, it is believed that the semiconductor layer 150 inside the hole is restricted by the dimension and space of the hole, such that the orientation of the semiconductor layer 150 inside the hole is different from that of the semiconductor layer 150 outside the hole. In details, the nanometer hole is surrounded by sidewall, and the interaction between the sidewall and the molecules of the semiconductor material in the hole may direct the arrangement of the molecules therein, such that the semiconductor material filled in the hole has an excellent molecular arrangement with a relatively higher proportion, and therefore has a relatively higher equivalent mobility. In various embodiments, the electron mobility of the portion 150a of the semiconductor layer 150 filled in the opening 142 is higher than that of the portion 150b of the semiconductor layer 150 out of the opening 142. For instance, the portion 150a of the semiconductor layer filled in the hole (e.g., opening 142) has face-on arrangement orientation, but the portion 150b of the semiconductor 150 outside the hole has edge-on arrangement orientation. In some embodiments, the portion 150a of the semiconductor layer 150 filled in the opening 142 has a crystal planes with a Miller Index (010), whereas the portion 150b of the semiconductor layer 150 over the second insulating layer 140 has crystal planes with Miller Index (100). In some embodiments, the semiconductor layer 150 includes organic semiconductor material or polymeric semiconductor material; as well, the organic semiconductor material or polymeric semiconductor material may form molecular crystal with excellent molecular arrangement. In one embodiment, the semiconductor layer includes poly(3-hexylthiophene-2,5-diyl) or other organic semiconductor materials. When the semiconductor layer 150 includes poly(3-hexylthiophene-2,5-diyl), the number average the molecule weight thereof may be ranged from about 50000 to about 80000, for example.

Figure 12:
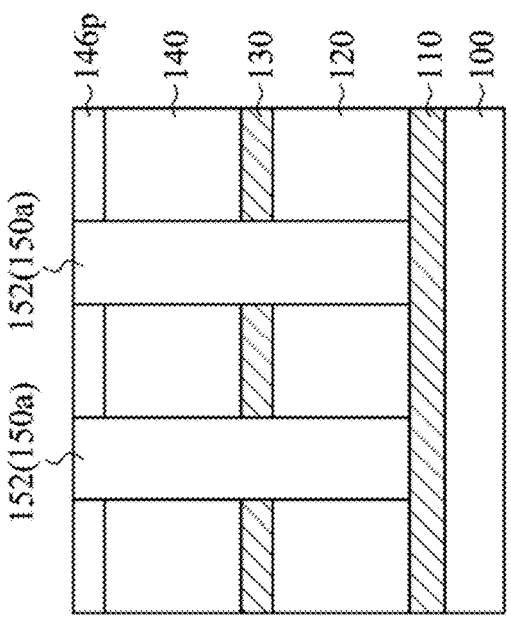

Referring to FIG. 1, in operation 14, the portion of the semiconductor layer positioned over the second insulating layer is removed, in which the portion of the semiconductor layer remained in the opening constitute a number of discrete semiconductor channels. Referring to FIG. 12, the portion 150b of the semiconductor layer 150 positioned over the second insulating layer may be removed, and the remained portion 150a of the semiconductor layer 150 in the opening 142 constitutes a number of discrete semiconductor channels 152. The bottom surfaces of the semiconductor channels 152 touch the first conductive layer 110, and the sidewalls of the semiconductor channels 152 touch the second conductive layer 130. In some embodiments, the approach to remove the portion 150b of the semiconductor layer 150 may be, for example, a reactive ion etching (RIE) process, or other suitable etching processes. The semiconductor channels 152 are constructed of the portion 150a of the semiconductor layer 150 remained in the opening 142, which has a relatively higher carrier mobility, while the portion 150b of the semiconductor layer 150 with relatively lower carrier mobility are removed. As a result, the semiconductor channels 152 have relatively higher carrier mobility. Though a number of semiconductor channels 152 are described in examples of this disclosure, the present disclosure is not limited to the pluralities of channels, and one single semiconductor channel is also in the scope of the embodiments of this disclosure.

Figure 14:
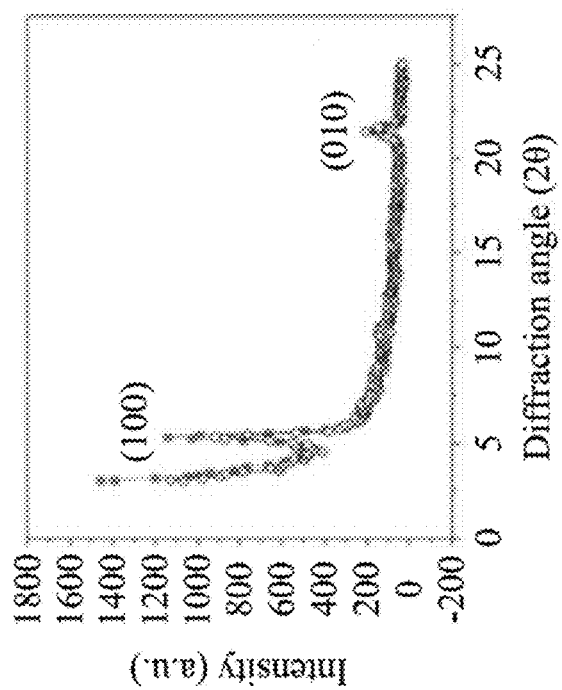
FIGS. 14-15 illustrate the X-ray diffraction spectrum (XRD) of the semiconductor layer in some embodiments of the present disclosure.
Figure 15:
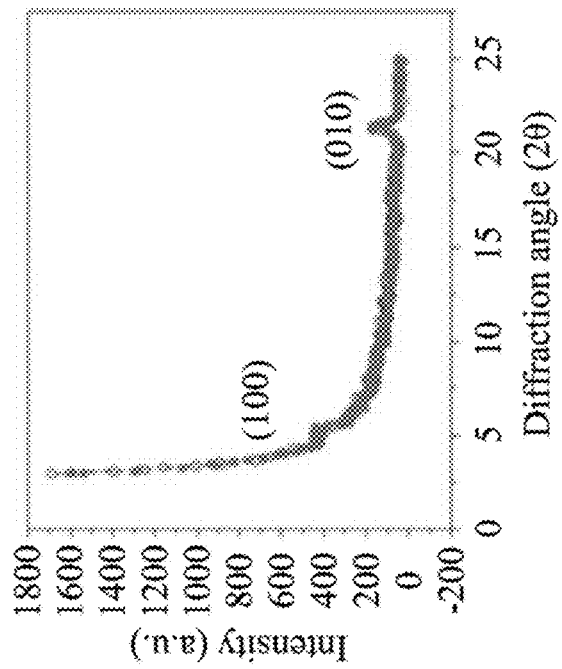

FIG. 14 shows the X-ray diffraction (XRD) spectrum associated with the structure of the semiconductor layer 150 illustrated in FIG. 11, and FIG. 15 shows the X-ray diffraction (XRD) spectrum associated with the portion 150a of the semiconductor layer 150 illustrated in FIG. 12. In FIG. 14, it may be found that the semiconductor layer 150 has a peak of (100) crystal planes and a peak of (010) crystal planes. In this embodiment, the (100) peak is associated with the x-ray diffraction produced by the edge-on arrangement orientation. The (010) peak is associated with the X-ray diffraction produced by the face-on arrangement orientation. In FIG. 15, it may be found that the peak of (100) crystal planes becomes very weak, while the peak of (010) crystal planes is relatively more prominent. As compared FIG. 14 with FIG. 15, it suggests that the portion 150a of the semiconductor layer 150 has (010) crystal planes and the portion 150b of the semiconductor 150 has (100) crystal planes.

Figure 13:
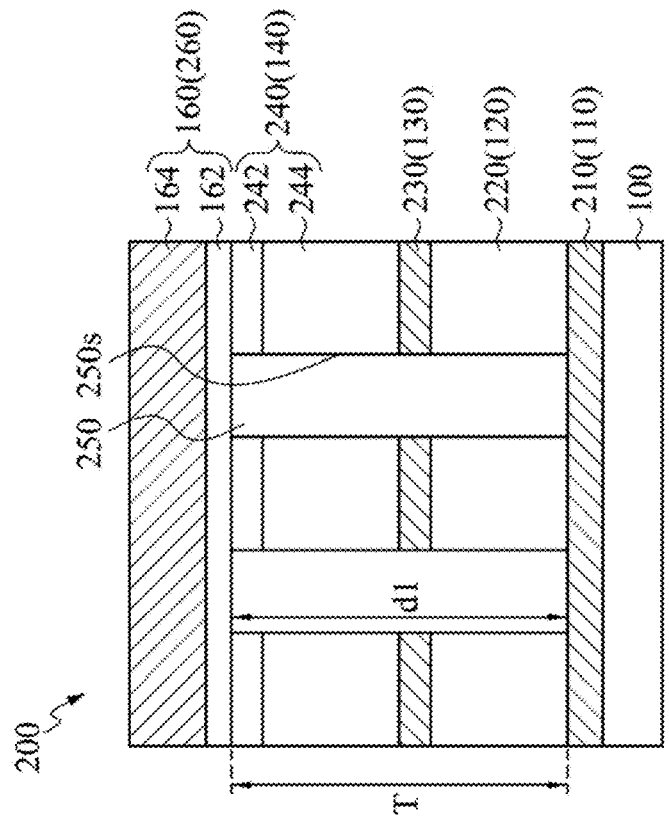

In operation 15, a third conductive layer is formed over the semiconductor channels. Referring to FIG. 13, a third conductive layer 160 is formed over the semiconductor channels 152. In some embodiments, the third conductive layer 160 may include metal materials such as for example aluminum, neodymium, nickel, copper and/or silver. The thickness of the second conductive layer 130 may be managed according to the requirement, for example, approximately from tens of nanometers to tens of micrometers. In some embodiments, the operation of forming the third conductive layer 160 includes forming a hole injection layer 162 on the semiconductor channels 152, and afterwards forming a metal layer 164 on the hole injection layer 162. In some embodiments, the metal layer 164 may include metals such as for example aluminum, neodymium, nickel, copper, and/or silver. When operation 15 is completed, a transistor 200 is manufactured. In various embodiments, the second conductive layer 130 serves as a base of the transistor 200, the first conductive layer 110 serves as a collector of the transistor 200, and the third conductive layer 160 serves as an emitter of the transistor 200.

Therefore, another aspect of the present disclosure is to provide a transistor. FIG. 13 also depicts a schematic cross-sectional view of a transistor 200 according to various embodiments of the present disclosure. The transistor 200 includes a first electrode 210, a first insulating layer 220, a second electrode 230, a second insulating layer 240, at least one semiconductor channel layer 250, and a third electrode 260.

The first electrode 210 is disposed on the substrate 100, and the first electrode 210, for example, may be made of metal, or transparent conductive material such as indium tin oxide. In some embodiments, the first electrode 210 is the collector of the transistor 200. In yet some embodiments, the first electrode 210 is the emitter of the transistor 200. The thickness of the first electrode 210 may be varied, according to the requirement, for example ranging from approximately tens of nanometers to tens of micrometers.

The first insulating layer 220 is over the first electrode 210. The first insulating layer 220 may be, for example, made of organic insulating material or inorganic insulating material. Illustrative examples of the organic insulating material include polyvinylpyrrolidone(PVP), polyamide, or the like. Illustrative examples of inorganic insulating material include silicon oxide, silicon nitride, and the like. The thickness of the first insulating layer 220 is not particularly limited. In examples, the thickness of the first insulating layer 220 may be ranged from approximately tens of nanometers to tens of micrometers.

The second electrode 230 is positioned over the first insulating layer 220. The second electrode 230 may include metal material such as aluminum, neodymium, nickel, copper and/or silver, for example. The thickness of the second electrode 230 may be varied, according to the requirement, for example ranging from approximately tens of nanometers to tens of micrometers.

The second insulating layer 240 is positioned over the second electrode 230. In some embodiments, the first insulating layer 220, the second electrode 230 and the second insulating layer 240 have substantially the same pattern in a plan view. In some embodiments, one or more openings which pass through the first insulating layer 220, the second electrode 230 and the second insulating layer 240 are formed by using an identical patterned mask layer to pattern the first insulating layer 220, the second electrode 230 and the second insulating layer 240. The second insulating layer 240 may be a single-layered or multiple-layered structure. In one embodiment, as depicted in FIG. 13, the second insulating layer 240 includes an insulating layer 244 and a hard mask layer 242. The insulating layer 244 is in contact with the second electrode 230 and the hard mask layer 242 is positioned on the insulating layer 244. In this example, the hard mask layer 242 is used as a patterned mask layer to etch the underneath layers, in which the hard mask layer 242 may be made of insulating material such as for example silicon oxide or silicon nitride, so that the hard mask layer 242 and the insulating layer 244 collectively constitute the second insulating layer 240. In other embodiments, the second insulating layer 240 includes the insulating layer 244, but excludes the hard mask layer 242. In some embodiments, the insulating layer 244 may be an insulating polymer layer, which includes polyvinylpyrrolidone(PVP), polyimide, or the like, for example. In yet some embodiments, the insulting layer 244 may be an inorganic insulating layer which includes, for example, silicon oxide, silicon nitride or the like. The thickness of the insulating layer 244 may be varied according to the requirement, for example, ranging from approximately tens of nanometers to tens of micrometers.

One or more semiconductor channel layers 250 extend upwards from the first electrode 210 and pass through the first insulating layer 220, the second electrode 230 and the second insulating layer 240. In various embodiments, the sidewall 250s of the each semiconductor channel layer 250 touches the first insulating layer 220, the second electrode 230 and the second insulating layer 240. In some embodiments, the semiconductor channel layer 250 is made of organic semiconductor material such as poly(3-hexylthiophene-2,5-diyl) or other organic semiconductor material. In some examples, the semiconductor channel layer 250 is face-on arrangement orientation. In some examples, the semiconductor channel layer 250 has crystal planes with Miller Index (010).

A third electrode 260 is positioned over the second insulating layer 240, and touches the top surface of the semiconductor channel layer 250. In some embodiments, the third electrode 260 includes hole injection layer 162 and a metal layer 164 on the hole injection layer 162. The hole injection layer 162 touches the top surface of the semiconductor channel layer 250. In some embodiments, the hole injection layer 262 may be made of molybdenum trioxide ($MoO_3$) or other suitable hole injection materials. The metal layer 164 may include metallic materials such as fore example aluminum, neodymium, nickel, copper and/or silver.

In some embodiments, the height d1 of the semiconductor channel layer 250 substantially equals a summed thickness T of the first insulating layer 220, the second electrode 230 and the second insulating layer 240.

It will be apparent to those skilled in the art that various modifications and variations can be made to the structure of the present disclosure without departing from the scope or spirit of the present disclosure. In view of the foregoing, it is intended that the present disclosure cover modifications and variations of the present disclosure provided they fall within the scope of the following claims and their equivalents.

What is claimed is:

1. A transistor, comprising:
   a first electrode;
   a first insulating layer positioned over the first electrode;
   a second electrode positioned over the first insulating layer;
   a second insulating layer positioned over the second electrode;
   a semiconductor channel layer extending upwards from the first electrode and passing through the first insulating layer, the second electrode, and the second insulating layer; and
   a third electrode positioned over the second insulating layer and in contact with a top surface of the semiconductor channel layer, wherein the semiconductor channel layer has a sidewall in contact with the first insulating layer, the second electrode, and the second insulating layer, wherein the semiconductor channel layer has a crystal plane Miller Index (010).

2. The transistor according to claim 1, wherein the second insulating layer includes an insulating polymer layer and a hard mask layer, wherein the insulating polymer layer is in contact with the second electrode, and the hard mask layer is positioned on the insulating polymer layer.

3. The transistor according to claim 1, wherein the semiconductor channel layer has a height substantially equal to the summed thickness of the first insulating layer, the second electrode and the second insulating layer.

4. A transistor, comprising:
a first electrode;
a first insulating layer positioned over the first electrode;
a second electrode positioned over the first insulating layer;
a second insulating layer positioned over the second electrode;
a semiconductor channel layer extending upwards from the first electrode and passing through the first insulating layer, the second electrode, and the second insulating layer; and
a third electrode positioned over the second insulating layer and in contact with a top surface of the semiconductor channel layer, wherein the third electrode includes a hole injection layer and a metal layer on the hole injection layer, wherein the hole injection layer is in contact with the top surface of the semiconductor channel layer.

5. A method of manufacturing a transistor, comprising:
sequentially forming a first conductive layer, a first insulating layer, a second conductive layer, and a second insulating layer in stack on a substrate;
patterning the first insulating layer, the second conductive layer, and the second insulating layer to form an opening passing through the first insulating layer, the second conductive layer, and the second insulating layer;
forming a semiconductor layer over the second insulating layer and filling the opening, wherein the semiconductor layer includes a polymeric semiconductor, and a portion of the semiconductor layer filled in the opening has a crystal plane with Miller Index (010), whereas a portion of the semiconductor layer positioned over the second insulating layer has a crystal plane with Miller Index (100);
removing a portion of the semiconductor layer positioned over the second insulating layer, wherein a remained portion of the semiconductor layer in the opening form a semiconductor channel; and
forming a third conductive layer over the semiconductor channel.

6. The method according to claim 5, wherein forming the third conductive layer over the semiconductor channel comprises:
forming a hole injection layer on the semiconductor channel; and
forming a metal layer on the hole injection layer.

7. The method according to claim 5, wherein patterning the first insulating layer, the second conductive layer, and the second insulating layer comprises:
disposing a plurality of particles on the second insulating layer;
depositing a mask layer covering the particles and the second insulating layer;
removing the particles and a portion of the mask layer positioned on the particles to form a patterned mask layer on the second insulating layer, wherein the patterned mask layer has a plurality of apertures exposing a portion of the second insulating layer; and
sequentially etching the second insulating layer, the second conductive layer, and the first insulating layer through the apertures of the patterned mask layer to form the opening passing through the first insulating layer, the second conductive layer, and the second insulating layer.

8. The method according to claim 7, wherein sequentially etching the second insulating layer, the second conductive layer, and the first insulating layer comprises:
applying a dry etching process to etch the second insulating layer;
applying a wet etching process to etch the second conductive layer; and
applying a dry etching process to etch the first insulating layer.

* * * * *